United States Patent [19]

Bismarck

[11] 4,314,166

[45] Feb. 2, 1982

[54] FAST LEVEL SHIFT CIRCUITS

[75] Inventor: Otto H. Bismarck, Fords, N.J.

[73] Assignee: RCA Corporation, New York, N.Y.

[21] Appl. No.: 123,714

[22] Filed: Feb. 22, 1980

[51] Int. Cl.[3] .................... H03K 19/092; H03K 5/01; H03K 5/12

[52] U.S. Cl. .................................... 307/475; 307/263; 307/264; 307/268; 307/451

[58] Field of Search ............... 307/263, 264, 451, 475, 307/268

[56] References Cited

U.S. PATENT DOCUMENTS

| | | | |
|---|---|---|---|
| 3,400,277 | 9/1968 | Bruckner | 307/264 |
| 3,867,649 | 2/1975 | Cochran | 307/268 |
| 3,906,254 | 9/1975 | Lane et al. | 307/475 |
| 3,958,136 | 5/1976 | Schroeder | 307/475 |
| 3,969,719 | 7/1976 | Sirocka et al. | 307/475 X |
| 4,031,409 | 6/1977 | Shimada et al. | 307/475 |
| 4,125,788 | 11/1978 | Kohmann | 307/264 |
| 4,258,272 | 3/1981 | Huang | 307/475 |

*Primary Examiner*—John Zazworsky
*Attorney, Agent, or Firm*—E. M. Whitacre; P. J. Rasmussen; A. L. Limberg

[57] ABSTRACT

A logic level converter for translating an input signal that swings between first and second voltage levels to an output signal that swings between third and fourth voltage levels. The input signal and its complement are first translated to the desired output levels in a pair of conventional CMOS inverters to produce complementary logic signals. The faster edge of each translated logic signal is used by logic means to control the output signal. Specifically, the leading edge of one logic signal and the trailing edge of the other logic signal are used to control the output signal. The resulting logic level shift circuit provides both fast rise and fall times, and substantially equal propagation delays for both high-to-low and low-to-high signal transitions.

6 Claims, 8 Drawing Figures

FAST LEVEL SHIFT CIRCUITS

BACKGROUND OF THE INVENTION

This invention relates to level shift means for interfacing logic circuits having dissimilar logic voltage levels.

In many digital systems, the need arises to interconnect logic elements from different logic families or to interconnect logic elements operated at different supply potentials. For example, to connect a transistor-transistor logic element (TTL) output to a complementary symmetry metal oxide semiconductor (CMOS) logic element input, an interface circuit is required to shift from the TTL logic levels (typically 0.8 to 2.4 volts) to the CMOS logic levels (typically 0 to 10 volts).

A common problem that many prior art level shift circuits share is that the rise and fall times of the output signal are unequal. Furthermore, propagation delays from input to output are unequal for high-to-low and low-to-high transitions. In a typical case, one edge of the level shifted signal, say the rising edge, will have a relatively slow rise time and long propagation delay. However, the falling edge will have a relatively fast fall time and correspondingly short propogation delay. Such unsymmetrical circuit response introduces signal overlap between concurrent logic signals which changes their timing relationship. Timing changes between logic signals, particularly in the case of control signals or clock signals, has an adverse effect on system operation.

Prior art attempts to equalize the level shifter response for output transitions in both directions involves the use of active pull-up and pull-down devices with controlled inputs for waveshaping the output signal. Such circuits tend to be complex and do not lead themselves to fabrication in digital integrated circuit form.

SUMMARY OF THE INVENTION

The present invention is embodied in a logic means for generating a level shifted output signal from an input signal and its complement. The input signal and its complement are level shifted. The faster edge of the level shifted input signal, for example, the leading edge, and the faster edge of the level shifted complemented input signal, which is therefore the trailing edge, are used to control the output signal. In the embodiment disclosed, the logic means includes memory means for storing the last state of the input signal and includes further logic means responsive to the memory means, for selecting the appropriate edge of either the level shifted input signal or the level shifted complemented input signal for propagation to the logic means output. The resulting output signal has both a fast rise time and a fast fall time which are substantially equal. Propagation delays through the logic means also tend to be equalized for both low-to-high and high-to-low transitions of the input signal.

DESCRIPTION OF A PREFERRED EMBODIMENT OF THE INVENTION

Figure 1:
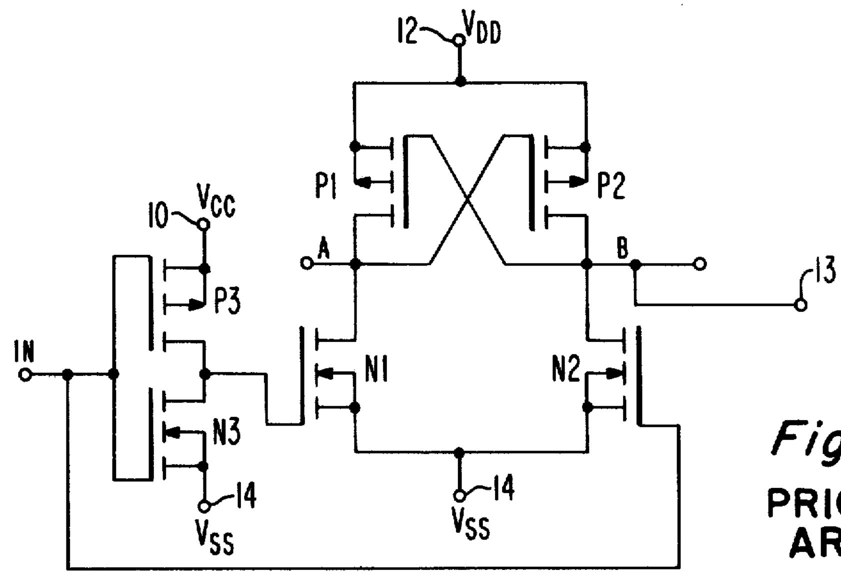
FIG. 1 is a schematic diagram of a prior art level shift circuit useful in conjunction with the invention.

A known circuit for level-shifting a logic signal is shown in FIG. 1. Transistors P1, P2, and P3 are each enhancement mode P-channel field-effect transistors (FET). Transistors N1, N2, and N3 are each enhancement mode N-channel FETs. The circuit has two stages. The input inverter stage P3,N3 supplies an input signal (terminal IN) and its complement to the respective gate electrodes of transistors N2 and N1. The output stage, which performs the level shift function, comprises transistors N1 and N2 serially connected to respective active load devices P1 and P2. The gates of P1 and P2 are cross-coupled to the respective drain electrodes of N2 and N1. For reasons which will become clear in the following description, transistors N1 and N2 are made relatively large as compared to transistors P1 and P2.

Power terminals 14 and 10 of the input stage are connected to respective first and second supply voltages $V_{SS}$ and $V_{CC}$, which are voltage levels corresponding to the logic levels of the input signal. Power terminals 14 and 12 of the output stage are connected to respective supply voltages $V_{SS}$ and $V_{DD}$, which voltage levels correspond to the logic levels of the output signal at terminal 13. In order to shift the upper level of input signal voltage to a more positive level in FIG. 1, $V_{DD}$ is made more positive than $V_{CC}$. It is noted that positive logic notation (wherein the most positive voltage level is logic 1) will be used herein as the standard convention. However, one skilled in the art will be able to represent the embodiments described in negative logic notation as well.

In operation, assume that the input signal is at $V_{CC}$ (logic 1). Transistor N2 is therefore turned on, which turns on transistor P1. At the same time, inverting amplifier N3 of the stage P3, N3 conducts and supplies the complement of the input signal ($V_{SS}$, i.e. logic 0) to the gate electrode of N1. Therefore N1 is turned off which turns off transistor P2. Notice that the gate drive to P2 ($V_{DD}$) is larger than the gate drive to N2 ($V_{CC}$). However, as mentioned above, N1 is larger than P1. The difference in size tends to compensate for the smaller gate drive available for N1, so that during switching, N1 can properly sink the current supplied by P1. The output signal at terminal 13 is now at $V_{SS}$ (logic 0) in the steady state.

When the input signal changes to $V_{SS}$, transistor N2 turns off. At the same time, transistor N1 turns on responsive to the gate drive supplied from transistor P3 of inverter pair P3, N3. Transistor N1 must be larger than P1 so that terminal A can be pulled to a lower potential, even though P1 and N1 are both momentarily on. Transistor P1 now tends to pull the potential at terminal A up while the larger transistor N1 competes to pull the potential at terminal A down. The lowered voltage at terminal A is applied to the gate of transistor P2, partially turning that transistor on. However, precisely because of the relatively small size of P2, the voltage at terminal B rises slowly. When the slow rising voltage at terminal B is large enough, transistor P1 is turned off. As transistor P1 turns off, the potential at terminal A goes to $V_{SS}$ through transistor N1. Although the inequality in size between P1 (P2) and N1 (N2) is necessary in order to assure that the level shifter will properly switch between logic states, such inequality causes the level shifted logic signal to have certain undesirable characteristics including, a fast falling edge and short propagation delay but a slow rising edge and long propagation delay. The present invented fast level shift circuit, in contrast, has both fast rise and fall times, and substantially equal propagation delays for both low-to-high, and high-to-low transitions.

It can be seen that the level shift circuit in FIG. 1 produces a level-shifted signal at terminal A corresponding in relative polarity to the input signal, and also produces a level-shifted signal at terminal B corresponding to the complement of the input signal.

Figure 7:
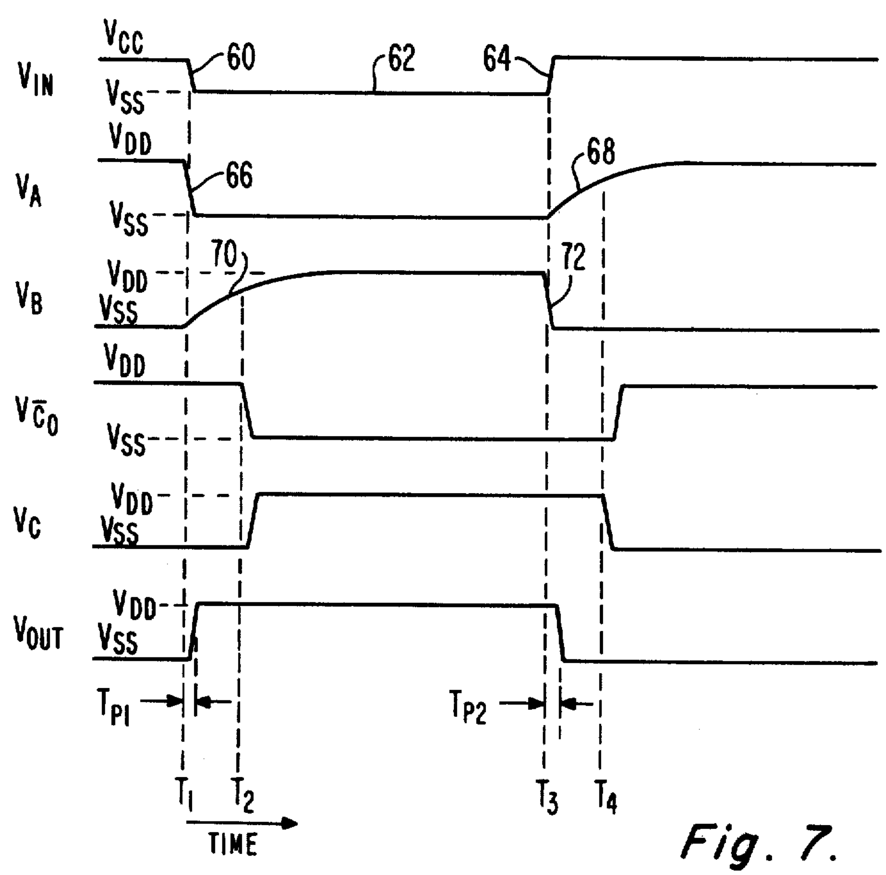
FIG. 7 is a timing diagram illustrating the relationship between particular signals for the circuits indicated in FIGS. 1, 3, 5 and 6.

FIG. 7 illustrates the circuit response at terminals A and B to an input signal at terminal IN of FIG. 1. The input signal switches between voltage levels $V_{SS}$ and $V_{CC}$ having fast rise and fall times 64,60. Output response at terminal A has a fast fall time 66, but a slow rise time 68. The output response at terminal B, which is the logical complement of the input signal, similarly has a slow rise time 70, but has a fast fall time 72. Note that the pulse signal at terminal A has a short transition time for its leading edge 66 relative to the trailing edge 68 thereof, while the inverted pulse signal at terminal B has a fast trailing edge 72 relative to the leading edge 70 thereof.

The resulting unsymmetrical circuit response, which is typical of many prior art level shift circuits, changes the timing relationship between concurrent logic signals. For example, although the input signal goes low at time $T_1$, the slow rising output signal at terminal B does not reach a logical high until time $T_2$. Similarly, although the input signal changes from low to high at time $T_3$ the output signal at terminal A does not reach a logic high until time $T_4$. Therefore, even though the signals at terminals A and B are complementary in the steady state, there are significant areas of overlap (from $T_1$ to $T_2$, and from $T_3$ to $T_4$) where both A and B are both logic 0.

Figure 2:
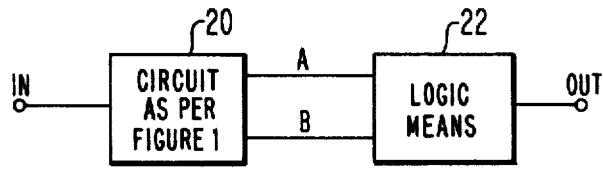
FIG. 2 is a block diagram of a level shift circuit in accordance with the present invention.

In accordance with the present invention, shown in FIG. 2, a logic means 22 is provided which is responsive to the faster, leading edge of the signal on terminal A and the faster, trailing edge of the signal on terminal B to provide the output signal on terminal OUT. The level shift means 20, which produces a level shifted representation, A, of the input signal, and a level shifted representation, B, of the complemented input signal, may be realized by the circuit of FIG. 1 which shifts the higher level of an input signal voltage to a more positive level. However, it will be appreciated that level shift means 20 may be any level shift means for translating an input logic signal including first and second voltage levels to an output logic signal including third and fourth voltage levels. Similarly, it will be understood that the logic means 22 preferably is operated at the translated logic signal levels, i.e., the third and fourth voltage levels, in controlling the output signal.

Figure 3:
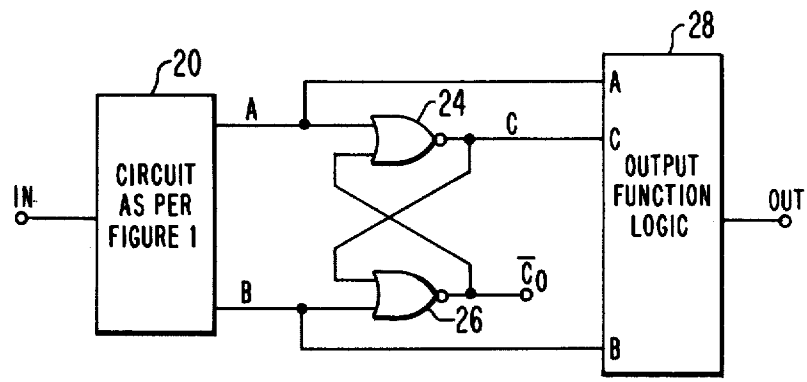
FIG. 3 is a schematic diagram, partially in block form, of a level shift circuit in accordance with the present invention.

A further detailed specific embodiment of the logic means 22 of FIG. 2 is shown by FIG. 3. A bistable flip-flop comprising cross-coupled NOR gates 24, 26 is a memory means which stores the past logic state of the input signal from terminal IN. The output, C, from the memory means is defined in a logic 1 state as representing that the input signal at terminal "IN" has a value of logical 0 and will go to a logical 1 at the next transition. Conversely, a logical 0 at terminal C represents that the input signal is at logical 1 and will go to logical 0 on the next transition. The output logic means portion 28 uses the complementary signals from terminals A and B in combination with the signal from terminal C to generate the output function.

To understand the generation of the desired output function obtained at the terminal "OUT" of means 28, reference is made to the level shifted signals at terminals A and B in FIG. 7. Prior to time $T_1$, the logic signal at terminal B is 0 and the logic signal at terminal A is 1. At time $T_1$, the input signal $V_{IN}$ on terminal IN switches from logic 1 to logic 0. Between time $T_1$ and $T_2$, the logic signal at terminal B is 0 and the logic signal at terminal A is 0. At time $T_2$, the slow rising signal on terminal B reaches the switching point between logic 0 and logic 1. Thereafter, from $T_2$ to $T_3$, the logic signal at terminal B is 1 and the logic signal at terminal A is 0.

At time $T_3$, $V_{IN}$ switches from logical 0 to logical 1. Between time $T_3$ and $T_4$, the logic signal at terminal B is 0 and the logic signal at terminal A is 0. At time $T_4$, the slow rising signal on terminal A reaches the switching point between logic 0 and logic 1. From time $T_4$ on, the logic signal at terminal B is 0 and the logic signal at terminal A is 1.

From the foregoing, it can be seen that logic signals at terminals B and A in FIG. 7 are 0,1 respectively, then 0,0 respectively, then 1,0 respectively, then 0,0 respectively, and finally 0,1 respectively. Note that A and B can never be logical 1 simultaneously and that transitions of the input signal are indicated by A and B both being logical 0 simultaneously.

The sequence of operation of the output function logic 28 responsive to an input signal pulse can be visualized as follows: when C is low (corresponding to a condition where a fast transition at terminal A is expected) and A and B both go low, then the complement of A is gated to the output. When B goes high (therefore A and B are not both low anymore) B, which is now in a steady state, is gated to the output. Some finite time later, the signal at the output of NOR gate 26 $\overline{C}_o$, changes to logical 0 in response to terminal B going high. A short time thereafter, equal to the delay of NOR gate 24, C changes to a logical 1. Therefore, the next expected transition of the input signal is a low-to-high transition. When A and B both go low again, with C at this time at a logical 1, then B (the fast transition) is gated to the output terminal.

The resulting output signal, shown in FIG. 7, may be compared to the input signal of the same figure. It can be seen that the embodiment described is an inverting level shift circuit, having substantially equal high-to-low and low-to-high propagation delays, equal to $T_{P1}$ and $T_{P2}$ respectively.

Figure 4:
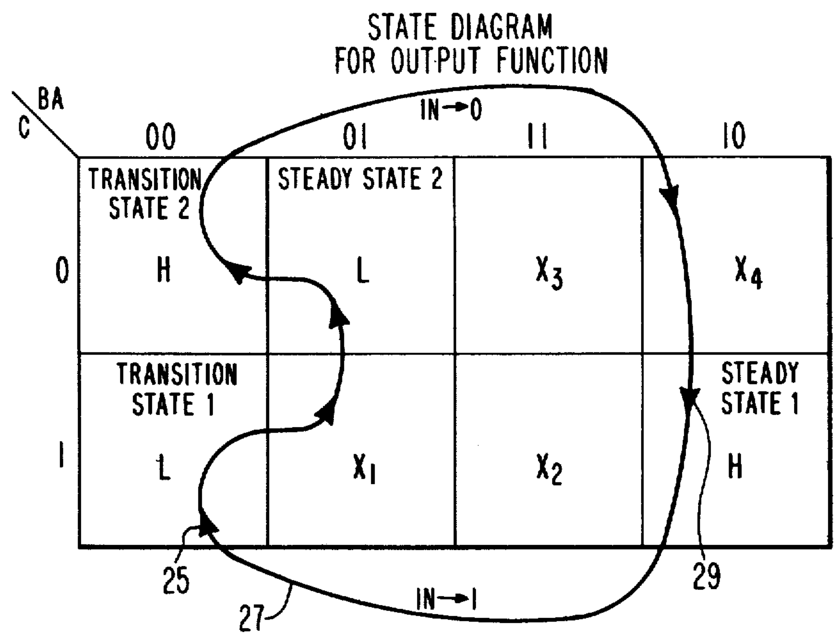
FIG. 4 is a Karnaugh map for the output function logic of the circuit of FIG. 3 and a state transition diagram for the logic circuit of FIG. 2.

The desired output function is depicted formally in the Karnaugh map and state transition diagram of FIG. 4, known to those skilled in the art. In each box, the output function is represented as a function of the variables A, B and C. An H represents logic 1 of the desired output, L represents logic 0 of the desired output, and $X_1$ through $X_4$ indicate chosen variables. The arrows represent transitions of the internal state logic responsive to transitions of the input signal. When the logical input signal, IN, equals 0 the steady state output is high as indicated in steady state 1. When IN changes to 1, (B,A=0,0) the output immediately goes low in transition state 1. State $X_1$ is assigned a logic 0 value so that when B,A changes to 0,1, the output function will remain low until C changes to 0 and steady state 2 is attained. Similarly, when IN goes low again, A and B are both 0, but now C is 0, corresponding to transition state 2. The output returns to steady state 1 via state $X_4$, which is assigned a logic 1 to maintain a logic high output function. States $X_2$ and $X_3$, which are true "don't care" states since A and B cannot both be logical 1 simultaneously, are assigned a logical 0 value to minimize the logic gate realization of the output function. By Boolean Algebra, the output function logic 28 is $\overline{A}(B+\overline{C})$.

Figure 5:
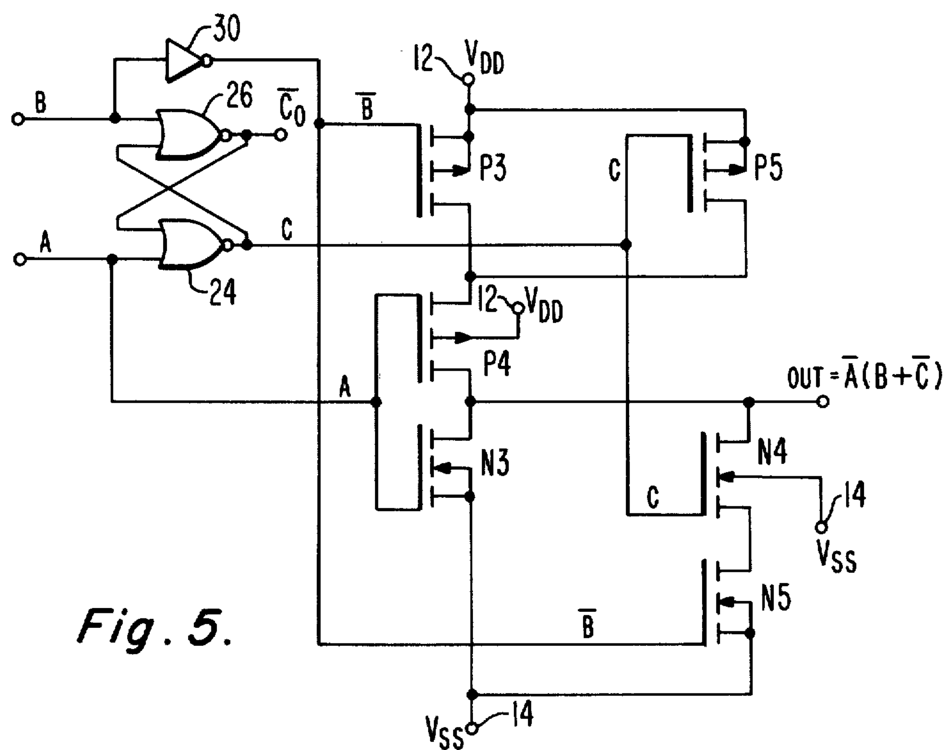
FIGS. 5 and 6 are schematic diagrams illustrating alternate embodiments of a logic means in accordance with the present invention.
Figure 6:
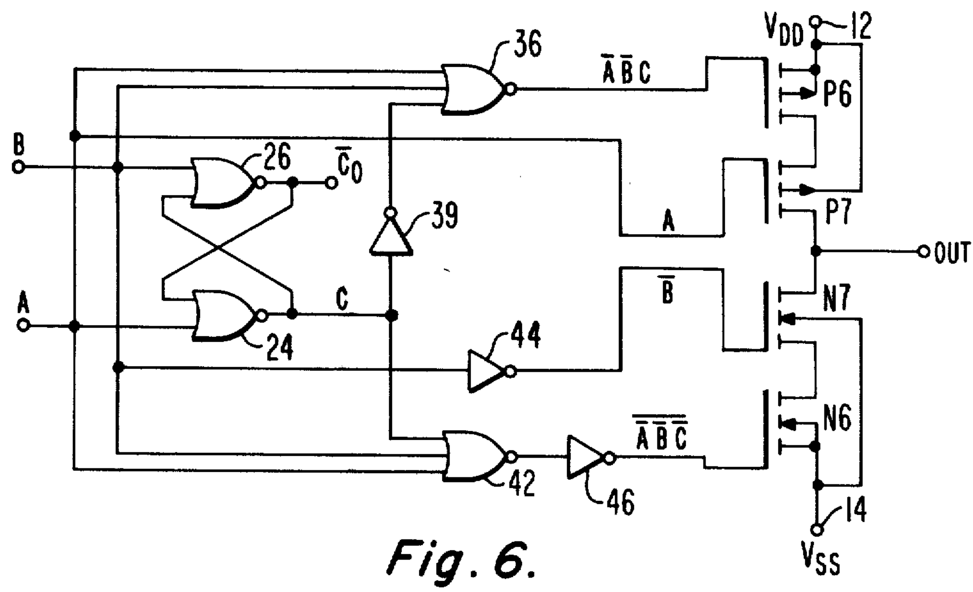

FIGS. 5 and 6 are alternate embodiments of the output function logic 28 of FIG. 3. Such logical embodiments are but examples of the many ways to realize the output function as defined by the Karnaugh map of FIG. 4.

In FIG. 5, conventional tree logic is used to realize the output logic function, $\overline{A}(B+\overline{C})$. Such tree logic is particularly suited for fabrication in CMOS technology. Transistors P3, P4, and P5 are each P-channel enhancement mode FET's and transistors N3, N4, and N5, are each N-channel enhancement mode FET's. When C is low (corresponding to a condition where a fast transition at terminal A is expected) transistor P5 is conditioned for conduction and N4 is conditioned for non-conduction. The output is therefore the complement of A via "inverter" pair P4,N3.

Logic signal B next goes high. Inverter 30 supplies $\overline{B}$ to the gate electrodes of P3 and N5 which respectively turns on P3 and turns off N5. Flip-flop output C responds shortly after B goes high by logic signal C going high. When C is high (corresponding to a condition where a fast transition on terminal B is expected), transistor P5 is conditioned for non-conduction and N4 is conditioned for conduction. At this time A is low so that transistor P4 is on and N3 is off. The output is therefore logically equal to B via the "inverter" formed by transistors P3,N5. The output function logic $\overline{A}(B+\overline{C})$ may also be realized by alternate logic means using any suitable logic elements having AND, OR, and complement capability.

FIG. 6 shows a slightly different approach to realizing the output function logic 28. Complementary transistors P7 and N7 form an "inner" inverter in series between transistors P6 and N6, which latter transistors form an "outer" inverter. When A and B are in a steady state ($\overline{A}=B$) the outer inverter transistors P6, N6 are conditioned for conduction. Therefore, the output is determined by the inner inverter P7, N7 which output is logically equivalent to the signal from terminal B. However, during input signal transitions, where A and B are both 0 ($\overline{A}\ \overline{B}=1$) then both inner transistors P7, N7 are conditioned for conduction and the output is determined by the outer inverter transistors P6,N6. Therefore, during such time A and B are both 0, the output is logically equivalent to the complemented flip-flop output, $\overline{C}$. After the transition period, A and B first change to their steady state before the flip-flop 24,26 changes to its next state. Thus, by the time C has changed to the next state, the "inner" inverter has already changed to the proper logical value so that the output function makes a proper transition between logic states, as indicated by the Karnaugh map and state transition diagram of FIG. 4.

Figure 8:
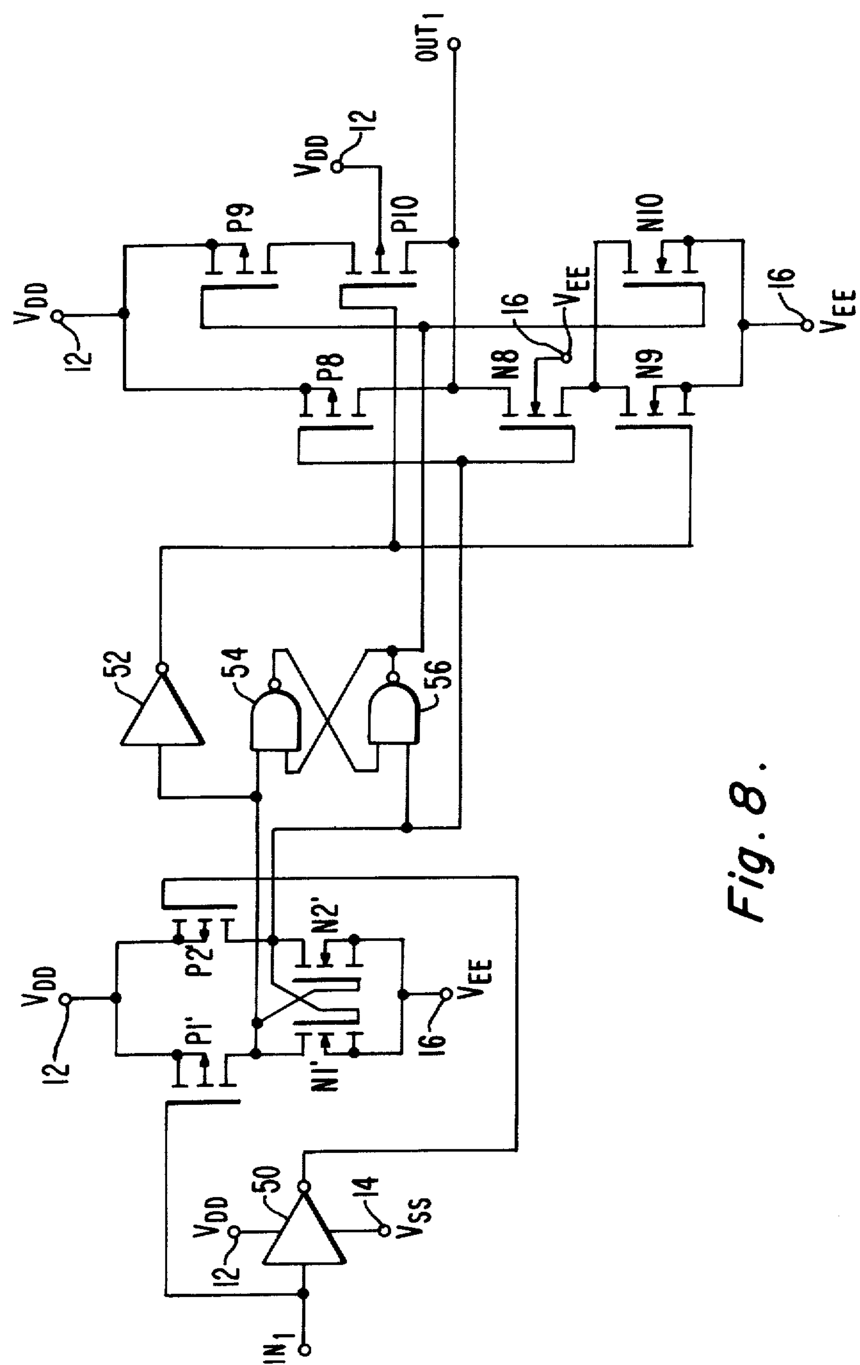
FIG. 8 is a schematic diagram of a level shift circuit in accordance with the present invention for shifting the lower level of input signal voltage to a more negative voltage level.

A level shift circuit for shifting the lower voltage level $V_{SS}$ of the input signal to a more negative voltage level $V_{EE}$ is shown in FIG. 8. The cross-coupled transistor pairs P1', N1', and P2', N2' will be recognized as analogous to the prior art level shifter shown in FIG. 1. In positive logic notation (where $V_{EE}$ is logical 0) NAND gates 54,56 are analogous to the memory means discussed above, and transistors P8, P9 and P10 in conjunction with complementary transistors N8, N9, and N10 are analogous to the tree logic described in conjunction with FIG. 5.

Of particular interest is the number of gate delays between input and output terminals. Recall that the signal path from input to output is different depending on whether the fast edge of the level shifted input signal or the fast edge of the inverted level shifted input signal is selected for propagation to the output terminal. For each path there are three gate delays. A first path is from terminal $IN_1$ via inverter 50, through level shifting inverter P2', N2', and through tree logic transistors P8, N8. The second path is from terminal $IN_1$, through level shifting inverter P1', N1', through inverter 52, and through tree logic transistors P10, N9. Propagation delays of the individual circuit elements are chosen so that the propagation delay from input to output for both high-to-low and low-to-high transitions of the input signal are substantially equal.

It will be appreciated that a fast level-shift circuit can be constructed in accordance with the present invention which uses other logic means responsive to the faster edge of a pair of level-shifted complementary input signals. For example, an edge detecting means may be employed which changes an output flip-flop to an appropriate state upon sensing a fast transition of the level shifted input signal or a fast transition of its level shifted complement.

What is claimed is:

1. A level shift circuit responsive to an input signal which includes first and second voltage levels, comprising:

means for translating said input signal to provide a first logic signal which includes said third and fourth voltage levels respectively corresponding to said first and second levels, and a complementary second logic signal which includes fourth and third voltage levels respectively corresponding to said first and second levels; and means for providing an output signal at said third voltage level responsive to a transition of said second logic signal from said fourth to said third voltage levels, and at said fourth voltage level responsive to a transition of said first logic signal from said fourth to said third voltage levels.

2. A level shift circuit responsive to an input signal pulse having respective leading and trailing edges, comprising:

means for translating said input signal to provide first and second logic signals, said first logic signal complementary to second logic signal, said first logic signal having a fast leading edge relative to its slower trailing edge, said second logic signal having a slow leading edge relative to its faster trailing edge; and means for providing an output signal at a first logic level responsive to the leading edge of said first logic signal, and at a second logic level responsive to the trailing edge of said second logic signal.

3. A level shift circuit according to claim 1 or 2 wherein said means for providing an output signal comprises:

an output terminal;

memory means for storing the past logic state of said input signal as either a first or second logic level, said memory means storing a corresponding first or second logic state, said memory means being updated to a new logic state when both first and second logic signals change to a logic level corresponding to said new logic state of said input signal; and logic means for gating the logical complement of said first logic signal to said output terminal when said memory means is in said first logic state and both of said first and second logic signals are at the same logic state, and for gating said second logic signal to said output terminal when said memory means is in said second logic state.

4. A level shift circuit according to claim 3 wherein said memory means comprises a bistable flip-flop responsive to said first and second logic signals, said bistable flip-flop providing a third logic signal representing said stored past logic state; and wherein said logic means comprises means responsive to said first, second, and third logic signals for generating said output signal on said output terminal, said output signal corresponding to the logical function of said second logic signal logically OR the complement of said third logic signal together logically AND the complement of said first logic signal.

5. In a level shift circuit responsive to an input signal which includes first and second voltage levels for generating an output signal which includes third and fourth voltage levels, a method comprising the steps of:

translating said input signal to provide a first logic signal which includes said third and fourth voltage levels respectively corresponding to said first and second voltage levels;

translating the complement of said input signal to provide a second logic signal which includes said fourth and third voltage levels respectively corresponding to said first and second voltage levels;

providing said output signal at said third voltage level responsive to a transition of said second logic signal from said fourth to said third voltage levels; and providing said output signal at said fourth voltage level responsive to a transition of said first logic signal from said fourth to said third voltage levels.

6. A method according to claim 5 wherein said steps providing said output signal at said third and fourth voltages comprise the following steps:

noting the past logic state of said input signal as being either one of a first and second logic state respectively corresponding to said first and second voltage levels, said noted past logic state being updated to a new logic state when both first and second logic signals change to a logic level corresponding to said new logic state of said input signal;

gating the logical complement of said first logic signal to said output terminal when said noted past logic state is said first logic state and both of said first and second logic signals are at said first voltage level; and gating said second logic signal to said output terminal when said noted past logic state is said second logic state.

* * * * *